United States Patent [19]

Muto

[11] Patent Number: 4,786,957
[45] Date of Patent: Nov. 22, 1988

[54] NEGATIVE DIFFERENTIAL RESISTANCE ELEMENT

[75] Inventor: Shunichi Muto, Isehara, Japan

[73] Assignee: Director-General of Agency of Industrial Science and Technology, Tokyo, Japan

[21] Appl. No.: 8,240

[22] Filed: Jan. 29, 1987

[30] Foreign Application Priority Data

Jan. 30, 1986 [JP] Japan .................................. 61-16700

[51] Int. Cl.[4] .................. H01L 29/06; H01L 29/205; H01L 29/70
[52] U.S. Cl. ........................................ 357/34; 357/16; 357/4
[58] Field of Search ............................. 357/4, 16, 34

[56] References Cited

FOREIGN PATENT DOCUMENTS

| 0068064 | 1/1983 | European Pat. Off. ................ 357/4 |
| 0159273 | 10/1985 | European Pat. Off. ................ 357/4 |
| 0177374 | 4/1986 | European Pat. Off. ................ 357/4 |
| 58-142574 | 8/1983 | Japan ..................................... 357/4 |

OTHER PUBLICATIONS

"Negative Resistance of Semiconductor Heterjunction Diodes Owing to Transmission Resonance", Y. Zohta, J. Appln. Phys. 57(6), Mar. 15, 1986, pp. 2234–2236.
"A New Functional Resonant-Tunneling Hot Electron Transistor (RHET)", N. Yokoyama et al, Japanese Journal of Applied Physics, vol. 24, No. 11, Nov. 1985, pp. L853–L854.

Primary Examiner—Andrew J. James
Assistant Examiner—Jerome Jackson
Attorney, Agent, or Firm—Armstrong, Nikaido, Marmelstein & Kubovcik

[57] ABSTRACT

A negative differential resistance element, the characteristics of which can be modulated externally, is provided by a sequential arrangement of an n-type GaAs emitter layer, a non-doped AlGaAs first barrier layer, an n-type GaAs base layer, a second barrier layer of a superlattice composed of coupled non-doped AlAs and GaAs thin layers, and an n-type collector layer. The conductivity of the emitter, base, and collector layers may be changed to p-type.

7 Claims, 5 Drawing Sheets

BAND DIAGRAM WHEN NOT BIASED

BAND DIAGRAM WHEN BIASED

NEGATIVE DIFFERENTIAL RESISTANCE ELEMENT

BACKGROUND OF THE INVENTION

1. Field of the Invention

The present invention relates to a negative differential resistance element, particularly to such an element having three terminals and which can be modulated externally.

2. Description of the Related Art

Known in the prior art are negative differential resistance elements, such as a degenerated p-n junction diode (Esaki diode), AlGaAs/GaAs heterojunction diode using resonant tunneling (R. Tsu and L. Esaki, "Tunneling in a finite superlattice", Applied Physics Letters, 22 (1973) p562), and a resonance diode with a potential barrier of AlGaAs/GaAs (Yasuhito Zohta, "Negative resistance of semiconductor heterojunction diodes owing to transition resonance" J. Appl. Phys. 57(6), Mar. 15, 1985, pp. 2234-2236) These negative differential resistance elements have two terminals and fixed characteristics, and can not be modulated externally.

Also known is a resonant-tunneling hot electron transistor (RHET) in which electrons are injected from emitter to base by resonant-tunneling through a quantum well (Naoki Yokoyama, etc. "A New Functional, Resonant-Tunneling Hot Electron Transistor (RHET)", Japanese Journal of Applied Physics, Vol. 24, No. 11, November, 1985, pp. L853-L854). This device shows a peaked collector-current characteristic with respect to the base-emitter voltage, i.e., a negative differential resistance. Another example is a three terminal, negative differential-resistance device using real-span-transfer (A. Kastalsky et al. "A Field-Effect Transistor with a Negative Differential Resistance").

SUMMARY OF THE INVENTION

The object of the invention is to provide a negative differential resistance element which has negative differential resistance characteristics capable of being modulated or controlled externally.

The object of the present invention is attained, in a hot electron transistor in which the emitter, base and collector are composed of gallium arsenide (GaAs) having one conductivity type and a non-doped aluminum gallium arsenide (AlGaAs) barrier is inserted between the emitter and the base, by inserting a superlattice layer of coupled aluminum arsenide (AlAs) and GaAs between the base and the collector.

Thus, according to the present invention, there is provided a negative differential resistance element, comprising a GaAs emitter layer of one conductivity type; a first barrier layer of non-doped AlGaAs in contact with the emitter layer; a GaAs base layer of the one conductivity type in contact with the first barrier layer on the opposite side of the emitter layer; a second barrier layer of a superlattice composed of a plurality of coupled non-doped AlAs and GaAs thin layers in contact with the base layer on the opposite side of the first barrier layer; a GaAs collector layer of the one conductivity type in contact with the second barrier layer on the opposite side of the base layer; an emitter electrode connected to the emitter layer; a base electrode connected to the base layer; a collector electrode connected to the collector layer; and means for biasing the element so that a carrier of said one conductivity type flows from the emitter layer to the collector layer via the base layer.

When the conductivity of the emitter, base and collector layers is n-type, the above carrier is an electron. When the conductivity is p-type, the carrier is a hole. Therefore, when the conductivity is n-type, for example, a voltage is applied between the emitter and the base so that the potential of the base is higher than that of the emitter, and a voltage between the base and the emitter is varied to control the characteristics of the negative differential resistance.

Further, since electrons passing from the emitter through the first barrier and injected into the base layer should have preferably an energy distribution width of about 50 meV, the width of the mini-band formed in the superlattice of the second barrier is preferably larger than that width of the energy distribution of the electrons.

DESCRIPTION OF THE PREFERRED EMBODIMENTS

Figure 1A:
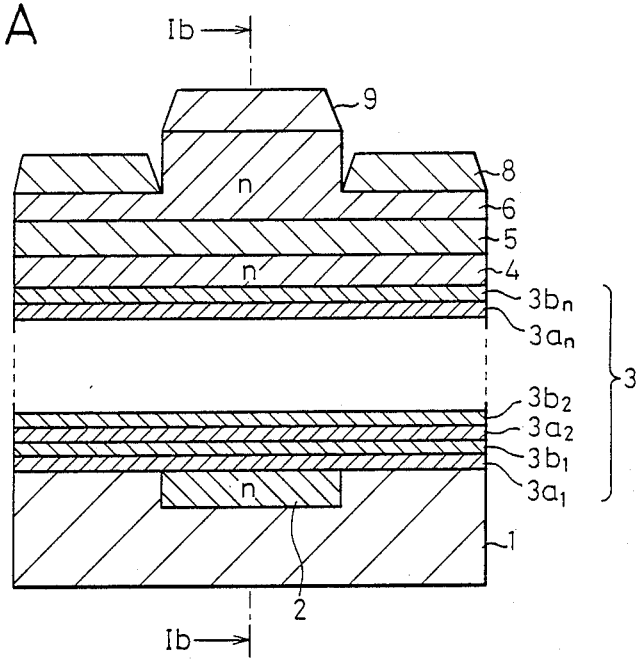
FIGS. 1A and 1B are front and side sectional views, respectively, of a negative differential resistance element according to the present invention.
Figure 1B:
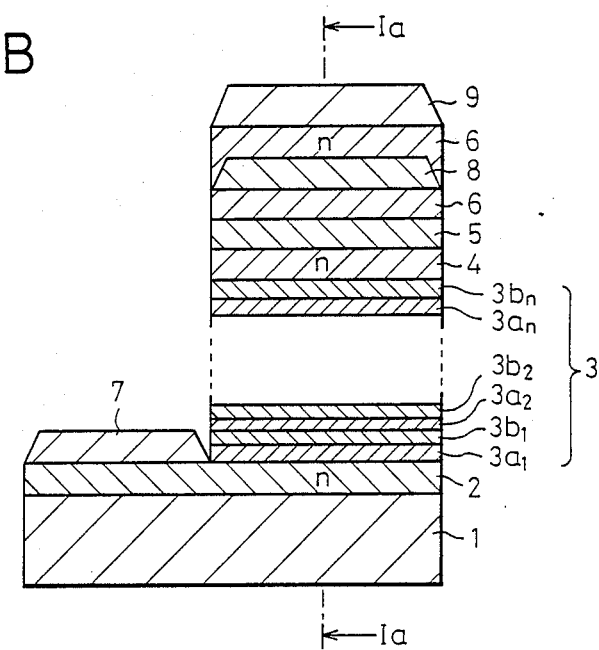

FIGS. 1A and 1B show front and side sectional views, respectively, of an example of a negative differential resistance element according to the present invention. In FIGS. 1A and 1B, reference numeral 1 denotes a semi-insulating GaAs substrate; 2 an n-type doped GaAs collector layer formed in the substrate 1 adjacent to the top surface of the substrate 1; 3 a second barrier layer of a superlattice layer composed of a plurality of coupled non-doped AlAs and GaAs thin layers; $3a_1$, $3a_2$, --- and $3a_n$ the non-doped AlAs thin layers; $3b_1$, $3b_2$ --- and $3b_n$ the non-doped GaAs thin layers; 4 an n-type GaAs base layer; 5 a first barrier layer of non-doped AlGaAs; 6 an n-type GaAs emitter layer; 7 a collector electrode; 8 a base electrode; and 9 an emitter electrode.

Figure 2:
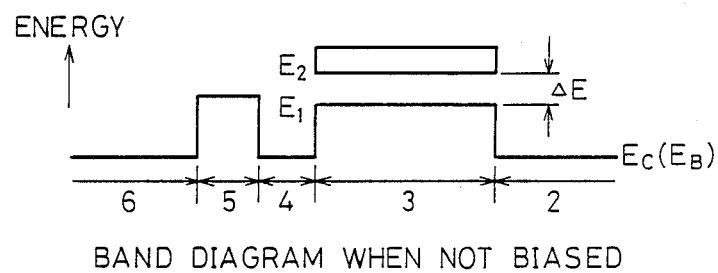
FIGS. 2 and 3 are band diagrams of the element, according to the present invention, when not biased and when biased, respectively.
Figure 3:
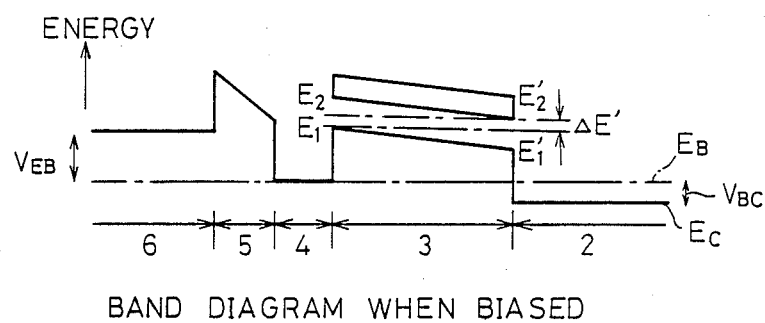

The energy band diagrams of the above negative differential resistance element according to the present invention are shown in FIGS. 2 and 3. FIG. 2 shows the energy band diagram when a bias is not applied to the element and FIG. 3 shows the energy band diagram when a bias is applied to the element or when operated. Since the first barrier layer 5 of AlGaAs has a larger band gap $E_g$ than that of the emitter and base layers 6 and 4 of GaAs, the level $E_c$ of the conduction band of the first barrier layer 5 is higher than that of the emitter and base layers 6 and 4. Therefore, the AlGaAs layer 5 having a higher level of the conduction band functions as a barrier layer for electrons of the carrier. Similarly, the AlAs layers, and therefore, the superlattice of the AlAs and GaAs layers, function as a barrier layer for electrons of the carrier. As seen in FIGS. 2 and 3, a mini-band appears in the second barrier layer 3 due to the superlattice structure composed of a plurality of coupled AlAs and GaAs thin layers. In the mini-band, only carriers having an energy between the lower and upper limits $E_1$ and $E_2$ of the mini-band can flow there selectively. Therefore, if hot electrons reaching the second barrier layer 3 have an energy between $E_1$ and $E_2$, those hot electrons selectively pass through the first barrier layer 3, but hot electrons having an energy other than between $E_1$ and $E_2$ are scattered.

When an emitter-base voltage $V_{EB}$ is applied between the emitter and base layers 6 and 4, and a base-collector voltage $V_{BC}$ is applied between the base and collector layers 4 and 2, the element becomes conductive between the emitter and collector layers 6 and 2, depending on the kinetic energy of hot electrons passing through the base layer 4, in other words, the emitter-base voltage $V_{EB}$. That is, the element becomes conductive between the emitter and collector layers 6 and 2 only when a voltage $V_{EB}$ is applied between the emitter and base layers 6 and 4, so that the kinetic energy of hot electrons passing through the base layer 4 corresponds to the mini-band, i.e., between $E_1$ and $E_2$. On the other hand, a width $\Delta E'$ of the energy of electrons that can pass through the second barrier layer 3 varies depending on a voltage applied between both ends of the second barrier layer 3, i.e., the base-collector voltage $V_{BC}$ (see FIG. 3). Thus, the current between the emitter and collector layers 6 and 2 varies, depending on both the emitter-base voltage $V_{EB}$ and the base-collector voltage $V_{BC}$.

Hot electrons injected into the base layer 4 almost ballistically pass through the base layer 4 and pass through the second barrier layer 3 with a possibility T. In this case, the current gain $\beta$ of the element is $$\beta = \frac{\alpha_0 T}{1 - \alpha_0 T}$$

where $\alpha_0$ represents a rate of hot electrons passing through the base layer 4 and is almost 1.

Figure 4:
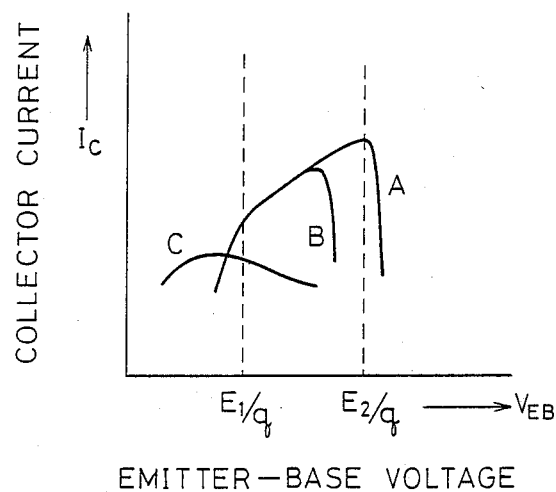
FIG. 4 shows collector current v.s. emitter-base voltage characteristics of the element according to the present invention.

As a result, the current $I_C$ between the emitter and collector layers 6 and 2 varies in accordance with the base-collector voltage $V_{BC}$, a parameter, as shown by the curves A to C in FIG. 4. In FIG. 4, the $I_C$–$I_{EB}$ characteristic is changed from the curve A to the curve C, when the base-collector voltage $V_{BC}$ is increased. FIG. 4 clearly demonstrates that the element described above functions as a negative differential resistance element capable of being modulated externally.

In a negative differential resistance element according to the present invention, preferably the second barrier layer has the following construction. The thickness of the thin AlAs layer is preferably in a range of the heptatomic layer (19.8 Å) or less to make the width ($\Delta E = E_2 - E_1$) of the mini-band larger than an energy width of hot electrons injected into the base layer, e.g., about 50 meV. The lower limit $E_1$ of the mini-band is preferably higher than 150 meV, to prevent a leakage of current between the base and the collector. The upper limit $E_2$ of the mini-band is desirably lower than 400 meV, to suppress logic amplitude and meet the requirement for high speed characteristics. To attain 150 meV $\leq E_1 \leq E_2 \leq 400$ meV, preferably the thickness of the GaAs thin layer is in a range of the hexatomic to dodecatomic layer (17.0 Å to 34.0 Å). The number of coupled AlAs and GaAs thin layers is preferably 10 or more, to attain a negligible reflectivity of the second barrier layer for electrons having an energy within the mini-band and a high reflectivity of the layer for electrons having an energy other than that. Further, the total thickness of the second barrier layer is preferably 1000 Å or more, to prevent a leakage of current between the base and collector layers. Furthermore, the first barrier layer preferably has a thickness of 200 Å or less, to attain a high emitter current density (more than about $10^4$ A/cm$^2$).

The fabrication of a negative differential resistance element according to the present invention is now described, with an example, with reference to the drawings.

Figure 5:
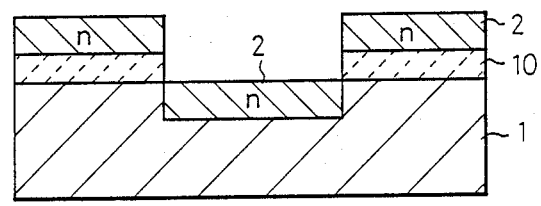
FIGS. 5 and 6 are sectional views of the element according to the present invention during the fabrication thereof.

Referring to FIG. 5, a silicon dioxide (SiO$_2$) layer 10 having a thickness of 500 Å is formed on a semi-insulating GaAs substrate 1. The SiO$_2$ layer 10 is patterned by photo lithography, and using the patterned SiO$_2$ layer 10 and a photoresist left thereon, as a mask, the semi-insulating GaAs substrate 1 is selectively etched to form an opening having a depth of about 2000 Å. Without removing the SiO$_2$ layer 10, an n-type GaAs layer 2 is deposited to a thickness of about 2000 Å by molecular beam epitaxy (MBE) or metal organic chemical vapor deposition (MOCVD), followed by removing the SiO$_2$ layer 10 together with a part of the deposited n-type GaAs layer 2 on the SiO$_2$ layer 10 (lift-off) to leave an n-type GaAs collector layer 2 which is embedded in the substrate 1. Preferably, the n-type collector layer has a dopant concentration of about $2 \times 10^{18}$ cm$^{-3}$ or more.

Figure 6:
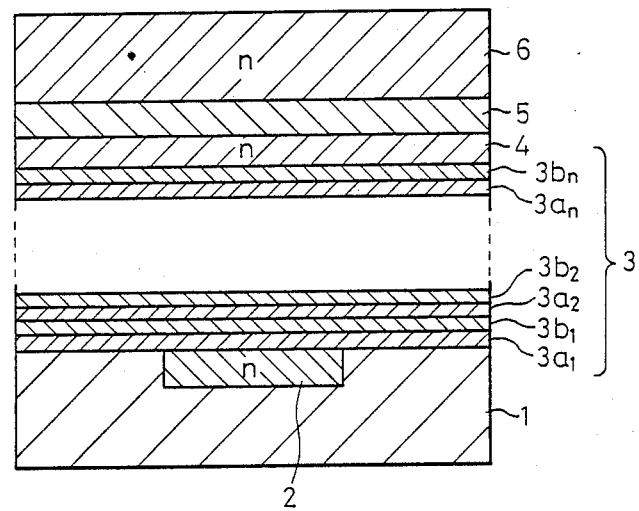

Referring to FIG. 6, after removing the SiO$_2$ layer 10, a second barrier layer 3 is formed on the n-type GaAs collector layer 2 or the semi-insulating GaAs substrate 1 by MBE or MOCVD. The second barrier layer 3 is a superlattice layer composed of coupled non-doped AlAs and GaAs thin layers. The AlAs thin layers $3a_1$, $3a_2$, --- $3a_n$ have a thickness of about 8.5 Å (triatomic layer), and the GaAs thin layers $3b_1$, $3b_2$ --- $3b_n$ have a thickness of about 22.5 Å (enneatomic layer). In this embodiment, there are sixty coupled AlAs and GaAs thin layers.

Next, on the second barrier layer 3, a base layer 4 of n-type GaAs having a dopant concentration of about $10^{18}$ cm$^{-3}$ and a thickness of about 200 Å is formed by MBE or MOCVD.

Subsequently, a first barrier layer 5 of non-doped AlGaAs having a thickness of about 200 Å is formed on the base layer 4 by MBE or MOCVD. The AlGaAs has a mixed crystal ratio of 0.3, i.e., a formula of Al$_{0.33}$Ga$_{0.67}$As.

Finally, by MBE or MOCVD, an emitter layer 6 of n-type GaAs having a dopant concentration of about $10^{19}$ and a thickness of about 4000 Å is formed on the first barrier layer 5.

As shown in FIG. 1A, the n-type GaAs emitter layer 6 is selectively etched to leave a thickness of about 100 Å except for a portion of the emitter layer 6 opposite and corresponding in width to the n-type GaAs collector layer 2.

A metal layer of, e.g., AuGe/Au, is deposited on the selectively etched portion of the emitter layer 6, and is then subjected to a heat treatment to bring it into chemic contact with the n-type GaAs base layer 4. Thus, a base electrode 8, or a control electrode, is formed. Similarly, a metal layer of, e.g., AuGe/Au, is deposited on the portion of the emitter layer corresponding to the collector layer 2, and the metal layer is then heat treated to bring it into ohmic contact with the n-type GaAs emitter layer 6. Thus, an emitter electrode 9 is formed.

Referring to FIG. 1B, which is a sectional view of the element taken along the line Ib-Ib in FIG. 1A, a metal layer of, e.g., AuGe/Au, is deposited on an exposed part of the n-type GaAs collector layer 2, followed by heat treatment to bring the metal layer into ohmic contact with the n-type collector layer 2. Thus, the collector electrode 7 is formed.

Figure 7:
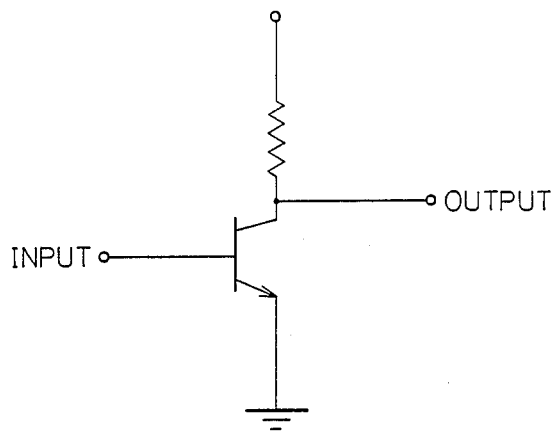
FIG. 7 shows a circuit involving the element according to the present invention; and, FIG. 8 shows the emitter-base voltage at the peak collector current vs base-collector voltage of the element according to the present invention.

The thus fabricated negative differential resistance element is incorporated in a circuit. FIG. 7 shows a common emitter type circuit. In this circuit, an emitter-base voltage $V_{EB}$ is an input and an emitter-collector current or a collector current $I_C$ is an output. The negative differential resistance characteristic of the element can be cotrolled or modulated by a base-collector voltage $V_{BC}$. Circuits other than shown in FIG. 7 can be used.

Figure 8:
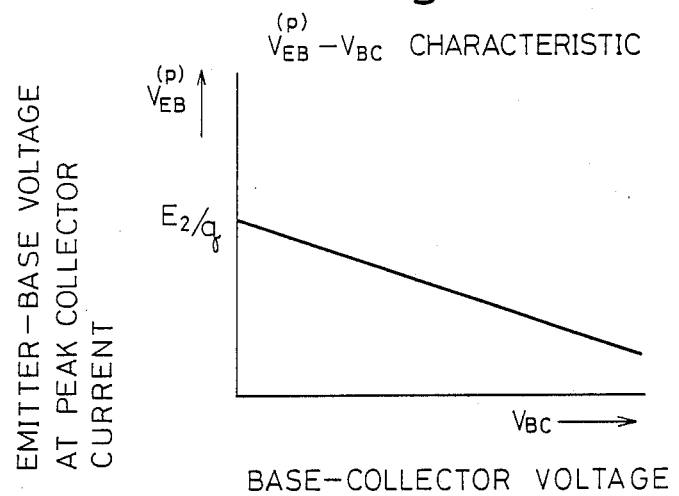

The energy band diagrams of the above negative differential resistance element when not biased and when biased are shown in FIGS. 2 and 3, respectively. As seen in FIG. 3, only hot electrons having an energy corresponding to te mini-band of the second barrier layer, more specifically, an energy higher than the lower limit $E_1$ of the mini-band on the end of the second barrier layer adjacent to the base layer and lower than the upper limit $E_2'$ of the mini-band on the end of the second barrier layer adjacent to the collector layer, can pass through the second barrier layer. Therefore, the collector current $I_C$ depends on the emitter-base voltage $V_{EB}$ which defines the energy of hot electrons. If the base-collector voltage $V_{BC}$ is constant, the collector current $I_C$ varies with the emitter-base voltage $V_{EB}$ as shown in FIG. 4. FIG. 4 indicates that a negative differential resistance characteristic appears above and near, the upper limit $E_2'$ of the min-band on the end of the second barrier layer adjacent to the collector layer. Further, the width $\Delta E'$ of the energy necessary for hot electrons to pass through the mini-band also varies, depending on the base-collector voltage $V_{BC}$. Therefore, the negative differential resistance characteristic of the element can be controlled or modulated by controlling the base-collector voltage $V_{BC}$, as shown by the curves A to B to C in FIG. 4. FIG. 8 shows the emitter-base voltage $V_{EB}$ giving a peak collector current $I_C$ at a constant base-collector voltage $V_{BC}$, in relation to the base-collector voltage $V_{BC}$.

I claim:

1. A negative differential resistance element, comprising
    a GaAs emitter layer of one conductivity type;
    a first barrier layer of non-doped AlGaAs in contact with the emitter layer;
    a GaAs base layer of the one conductivity type in contact with the first barrier layer on the opposite side of the emitter layer;
    a second barrier layer of a superlattice composed of a plurality of coupled non-doped AlAs and GaAs thin layers in contact with the base layer on the opposite side of the first barrier layer;
    a GaAs collector layer of the one conductivity type in contact with the second barrier layer on the opposite side of the base layer;
    an emitter electrode connected to the emitter layer;
    a base electrode connected to the base layer;
    a collector electrode connected to the collector layer; and,
    means for biasing the element so that a carrier of said one conductivity type flows from the emitter layer to the collector layer via the base layer.

2. An element according to claim 1, wherein each of the thin AlAs layers in the second barrier layer has a thickness of a heptatomic layer or less.

3. An element according to claim 1, wherein each of the thin GaAs layers in the second barrier layer has a thickness of a hexatomic to dodecatomic layer.

4. An element according to claim 1, wherein the number of the coupled thin AlAs and GaAs layers is ten or more.

5. An element according to claim 1, wherein the thickness of the second barrier layer is 1000 Å or more.

6. An element according to claim 1, wherein the thickness of the first barrier layer is 200 Å or less.

7. A negative differential resistance element as recited in claim 1 wherein said emitter and base electrodes constitute an input for an emitter-based voltage $V_{EB}$, said collector electrode constitutes an output for a current $I_C$, and said means for biasing the element is a base-collector voltage $V_{BC}$ applied to said base and collector electrodes for controlling negative differential resistance characteristic of said element.

* * * * *